US007092530B1

(12) United States Patent
Beer et al.

(10) Patent No.: US 7,092,530 B1
(45) Date of Patent: Aug. 15, 2006

(54) MOTOR VEHICLE AUDIO SYSTEM

(75) Inventors: Rainer Beer, München (DE); Alfred Grom, Glonn (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 09/868,522

(22) PCT Filed: Nov. 22, 1999

(86) PCT No.: PCT/EP99/08989

§ 371 (c)(1),
(2), (4) Date: Nov. 5, 2001

(87) PCT Pub. No.: WO00/38476

PCT Pub. Date: Jun. 29, 2000

(30) Foreign Application Priority Data

Dec. 19, 1998 (DE) ................................ 198 58 836

(51) Int. Cl.
*H04B 1/00* (2006.01)
*H03F 21/00* (2006.01)

(52) U.S. Cl. ......................................... 381/86; 381/120

(58) Field of Classification Search .................. 381/86, 381/120, 98–99, 57–59; 330/207 A, 251, 330/10, 126, 124, 59
See application file for complete search history.

(56) References Cited

U.S. PATENT DOCUMENTS 4,180,782 A * 12/1979 Kaplan ....................... 330/276
4,282,605 A 8/1981 Bose .......................... 455/617
4,636,741 A 1/1987 Mitzlaff ...................... 330/127
4,752,747 A 6/1988 Botti et al. ................. 330/297
4,809,338 A * 2/1989 House ........................ 381/103
5,426,394 A * 6/1995 Chiok ........................ 330/149
5,834,977 A 11/1998 Machara et al. ............ 330/297
5,983,087 A * 11/1999 Milne et al. ................ 455/149
6,310,959 B1 * 10/2001 Alexander ................... 381/99
6,766,026 B1 * 7/2004 Caldwell ..................... 381/98

FOREIGN PATENT DOCUMENTS

EP 0 027 043 4/1984
EP 0 492 286 A2 7/1992

OTHER PUBLICATIONS

International Search Report for PCT/EP 99/08989 (Dated Aug. 3, 2000).
German Search Report for DE 198 58 836.4 (Dated Sep. 7, 1999).

* cited by examiner

*Primary Examiner*—Laura A. Grier
(74) *Attorney, Agent, or Firm*—Crowell & Moring LLP

(57) ABSTRACT

A motor vehicle audio system having an audio signal receiver, an amplifier connected thereto via a fiber optic cable and a loudspeaker. A separate amplifier is provided for low audio signals. The amplifier is provided with a substantially higher line voltage when compared with the other audio frequency amplifiers.

5 Claims, 1 Drawing Sheet

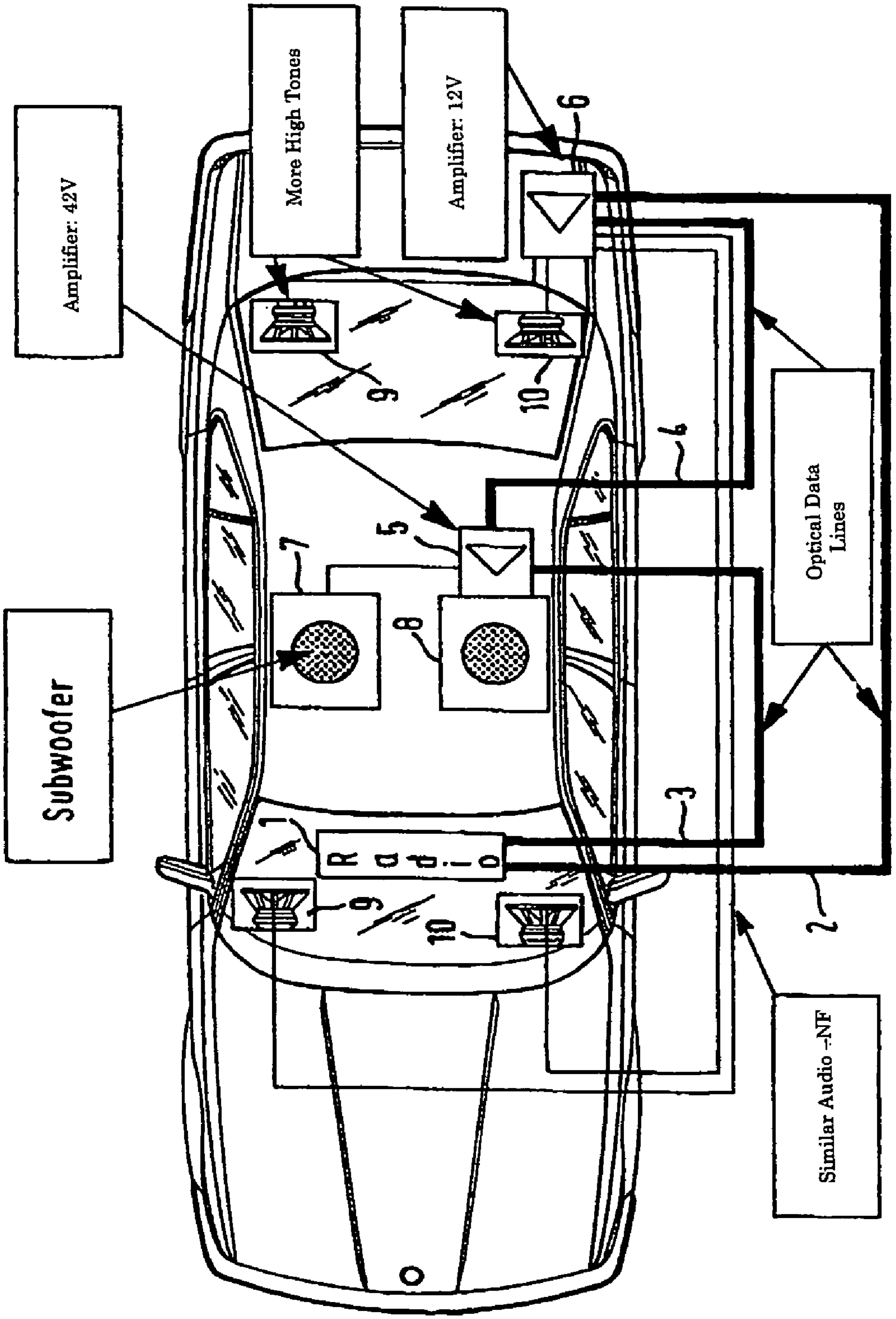
Amplifier: 42V
More High Tones
Amplifier: 12V
Subwoofer
Optical Data Lines
Similar Audio –NF
Radio
1
2
3
4
5
6
7
8
9
10

MOTOR VEHICLE AUDIO SYSTEM

BACKGROUND AND SUMMARY OF THE INVENTION

The invention relates to a motor vehicle audio system comprising an audio signal receiver, at least one amplifier connected thereto by way of an optical waveguide, and a loudspeaker.

A system of this type is known from European Patent Document EP 0 027 043 B (corresponding U.S. Pat. No. 4,282,605). Such an audio system is operated by means of an operating voltage which is equal to the normal onboard power supply voltage of preferably 12 volt. In the case of loudspeakers with a resistance of 8Ω, particularly in the case of powerful amplifiers, a distortion factor occurs which is also clearly noticeable acoustically and which impairs the listening enjoyment. If, on the other hand, a higher operating voltage is to be used for the amplifiers in order to avoid the harmonic distortion, the interferences, which necessarily occur in the onboard power supply and which also occur on the supply lines of the amplifiers, result in clearly audible clicks and plops.

It is an object of the invention to provide an audio system of the initially mentioned type which permits an undisturbed listening enjoyment.

The invention achieves this object by providing an audio system of the type referred to above, wherein a separate amplifier is supplied with a significantly higher operating voltage than the at least one amplifier for other audio frequencies.

The invention provides a separation of the audio signals of the bass range and a separate amplification therefor. The high operating voltage is used only for supplying the separate amplifier. In addition, the use of two independent amplifiers can also be provided for the medium/high frequency range.

The amplifier of the bass range receives a supply voltage of preferably 42 volt, while the medium/high frequency range is supplied with, for example, 12 volt.

Occurring electric interferences do not affect the bass range because they have significantly higher frequencies. The use of a supply voltage of 42 V therefore results in a high power yield in the low-bass range while simultaneously acoustic interferences cannot be perceived. In contrast, such a high power yield is not required for the medium/high frequency range. The use of amplifiers with 12V permits a sufficient power yield. The power required for the medium/high frequency range can and will clearly be lower than for the bass range.

The invention will be further explained by means of the drawing.

BRIEF DESCRIPTION OF THE DRAWING

The single drawing FIGURE is a schematic top view of an automobile with an audio system constructed according to a preferred embodiment of the invention.

DETAILED DESCRIPTION OF THE DRAWING

The only FIGURE is a top view of the systematic construction of an audio system according to the invention. An audio signal receiver (radio) 1 is connected with amplifiers 5 and 6 by way of optical waveguides 2 to 4. At least one of the optical waveguides 2 to 4 is a component of a (ring) bus system.

At the beginning and the end of each of the optical waveguides, an electro-optical or opto-electrical transducer is situated which transforms the incoming electrical or optical signals into corresponding optical or electrical signals.

Subwoofers 7 and 8 for the playback of deep audio frequencies are connected to the output side of the amplifier 5, and medium/high frequency speakers 9 and 10 for the playback of the correspondingly remaining audio frequencies are connected to the output side of the amplifier 6.

According to the invention, the amplifier 5 is supplied with an operating voltage of 42V and the amplifier 6 is supplied with an operating voltage of 12V.

As a result of the galvanic separation of the radio 1 and the amplifiers 5 and 6, electrical interferences, which occur mainly in but also outside the vehicle, are not transmitted to the amplifiers 5 and 6. By means of the amplifier 5, a high power yield can be obtained. Since, as a result, only deep frequencies are amplified and played back by way of the loudspeakers 7 and 8, occurring high-frequency interferences are not noticeable acoustically.

The medium/high frequency speakers 9 and 10 are supplied with a lower operating voltage of 12V. The thus achievable power yield of, for example, 20 W, is sufficient also in cases in which the subwoofers 7 and 8 are acted upon by a high power of, for example, 100 W. As a result of the lower power requirement, the distortion factor can therefore be minimized.

What is claimed is:

1. Motor vehicle audio system for a vehicle operated by an electrical system providing a first voltage, said audio system comprising an audio signal receiver, at least one amplifier supplied by said first voltage connected thereto by way of an optical waveguide, and a loudspeaker, wherein a separate amplifier is provided for low audio frequencies, which separate amplifier is supplied with a significantly higher operating voltage than the first voltage supplied to said at least one amplifier for other audio frequencies.

2. Motor vehicle audio system according to claim 1, wherein the operating voltage of the separate amplifier is at least equal to 42 volt in comparison to 12 volt for the at least one amplifier of the other audio frequencies.

3. A motor vehicle audio system for a vehicle operated by an electrical system providing a first voltage, said audio system comprising:

an audio signal receiver, a first amplifier supplied by said first voltage connected by an optical wave guide with the receiver, a second amplifier connected by another optical wave guide with the receiver, at least one low frequency speaker connected to an output of said first amplifier, and at least one higher frequency speaker connected to an output of said second amplifier, wherein said second amplifier is supplied with a voltage substantially different than said first voltage.

4. A motor vehicle audio system according to claim 3, wherein said first amplifier is supplied with a substantially higher voltage than is supplied to the second amplifier.

5. A motor vehicle audio system according to claim 4, wherein said first amplifier is supplied with more than twice the voltage supplied to the second amplifier.

* * * * *